United States Patent
Ju

(10) Patent No.: US 7,530,817 B2
(45) Date of Patent: May 12, 2009

(54) ELECTRICAL CONNECTOR FOR ELECTRICALLY CONNECTING A CHIP MODULE TO A PCB

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/078,678

(22) Filed: Apr. 3, 2008

(65) Prior Publication Data
US 2009/0029568 A1    Jan. 29, 2009

(30) Foreign Application Priority Data
Jul. 26, 2007    (CN) .................... 2007 2 0054655 U

(51) Int. Cl.
*H01R 12/00*    (2006.01)
(52) U.S. Cl. .......................................... 439/70; 439/71
(58) Field of Classification Search ............... 439/70, 439/71
See application file for complete search history.

(56) References Cited

U.S. PATENT DOCUMENTS 4,037,270 A * 7/1977 Ahmann et al. ............... 439/71
6,948,946 B1 * 9/2005 Ju ................................ 439/71
7,128,580 B2 * 10/2006 Liao et al. .................... 439/71
2006/0089016 A1 * 4/2006 Xie et al. ..................... 439/71

* cited by examiner

*Primary Examiner*—Tho D Ta
(74) *Attorney, Agent, or Firm*—Rosenberg, Klein & Lee

(57) ABSTRACT

An electrical connector comprises an insulation body, a plurality of terminals, and an elastic part; the insulation body is provided with the first and the second sidewalls oppositing to each other; an accommodation space being formed and enclosed in the first and second sidewalls for accommodating a chip module. Each terminal is accommodated in the insulation body and is provided with an elastic arm protruding and stretching into the accommodation space; the elastic arm is provided with a contact portion for contacting an electrically conductive slice of the chip module. The elastic part is accommodated in the insulation body and used to precisely locate the electrically conductive slice and the contact portion. Being pressed downwards, the electrically conductive slice of the chip module presses the elastic arm, and the elastic arm bends toward the second sidewall and deforms, so that the chip module moves toward the second sidewall.

7 Claims, 3 Drawing Sheets

ELECTRICAL CONNECTOR FOR ELECTRICALLY CONNECTING A CHIP MODULE TO A PCB

BACKGROUND OF THE INVENTION

1. Field of the Invention

This invention relates to an electrical connector and particularly to an electrical connector electrically connecting a chip module to a PCB, in which an elastic part is located in an insulation body to precisely locate the chip module and terminals disposed in the insulation body.

2. Description of Related Art

Currently, an electrical connector connects a chip module to a PCB, as shown in FIG. 1 through FIG. 3. The electrical connector comprises an insulation body 10 and a plurality of terminals 20. The insulation body 10 is provided with a plurality of terminal accommodation holes 11 in which each of the terminals 20 is correspondingly accommodated. The insulation body 10 is provided with a first sidewalls 12 and a second sidewalls 13. The second sidewall 13 is opposite to the first sidewall 12. An accommodation space 14 for a chip module 30 is enclosed in the first sidewall 12 and the second sidewall 13. Each terminal 20 comprises a lengthwise elastic arm 21 provided with a contact portion 211 contacting an electrically conductive slice 31 of the chip module 30. The chip module 30 is pressed to make the electrically conductive slices 31 contact the contact portions 211 of the terminals 20. At the time of assembly, the chip module 30 is firstly pressed downwards, and when the electrically conductive slice 31 of the chip module 30 contacts the contact portion 211 of the terminal 20 at the right moment, as shown in FIG. 2, the chip module 30 is continually pressed downwards so as to make the chip module 30 fully locate in the accommodation space 14 of the insulation body 10. When the chip module 30 is continually pressed downwards, the elastic arm 21 of terminal 20 is pressed and properly deformed forward and downwards. Being longer, the elastic arm 21 that receives the pressed force from the chip module is bent and deformed to a higher extent and slowly drives the chip module 30 forward, and whereby the chip module 30 slowly approaches the second sidewall 13 of the insulation body 10. When the chip module 30 leans against the second sidewall 13, the chip module 30 directly touches the second sidewall 13 and forces the second sidewall 13 to warp outwards. Thus, the chip module 30 cannot match closely with the first sidewall 12 of the insulation body 10, and a gap is formed between the chip module 30 and the first sidewall 12. Due to the terminal 20 is bent and deformed, and the chip module 30 moves towards the second sidewall 13, so the gap is permanently formed between the chip module 30 and the first sidewall 12, and thus the electrically conductive slices 31 of the chip module 30 cannot contact the contact portions 211 of the terminals 20, which then affects the electrical connection between the chip module 30 and the PCB.

Thus, a new type of an electrical connector is necessary to prevent the defect mentioned above.

Consequently, because of the technical defect described above, the applicant keeps on carving unflaggingly through wholehearted experience and develop the present invention, which can effectively improve the defect described above.

SUMMARY OF THE INVENTION

In this invention, an electrical connector is provided with an elastic part making a precise location between a chip module and terminals in an insulation body.

The electrical connector according to this invention, which is used to electrically connect the chip module to a PCB, comprises an insulation body, a plurality of terminals accommodated in the insulation body, and an elastic part accommodated in the insulation body. The insulation body is provided with a first sidewall and a second sidewall that are opposite to each other, and an accommodation space for a chip module is formed and enclosed in the first and second sidewalls. Each terminal is provided with an elastic arm that is protruding and stretching into the accommodation space, and the elastic arm is provided with a contact portion contacting an electrically conductive slice of the chip module. The elastic part is used to precisely locate the electrically conductive slice and the contact portion.

Thus, when the chip module is pressed downwards, the electrically conductive slice of the chip module pushes down the elastic arm of the terminal. When being pressed, the elastic arm bends toward the second sidewall and deforms, which causes the chip module to move toward the second sidewall. The elastic part is near the second sidewall and thus the chip module directly lean against the elastic part so as to prevent the chip module from directly leaning against the second sidewall; thereby the chip module appropriately moves toward the first sidewall for precise location between the electrically conductive slice and the contact portion.

DETAILED DESCRIPTION OF THE PREFERRED EMBODIMENTS

Now, the present invention will be described more specifically with the following embodiments together with the appended drawings. It is to be noted that the following descriptions of preferred embodiments of this invention are presented herein for purpose of illustration and description only; it is not intended to be exhaustive or to be limited to the precise form disclosed.

In the description mentioned above, only the detailed description and drawings of the embodiments of this invention are provided without limit to this invention and the characteristics of this invention.

Figure 1:
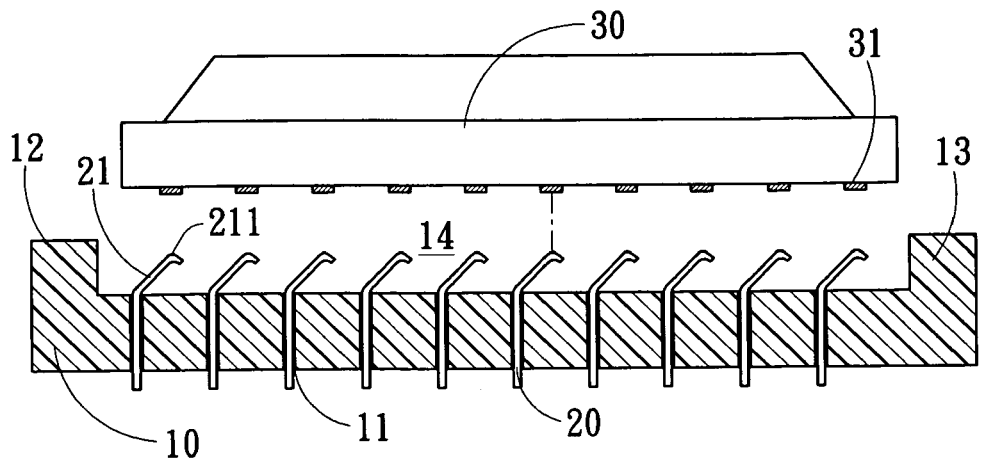
FIG. 1 is a schematic view illustrating a conventional electrical connector before assembled with a chip module.
Figure 2:
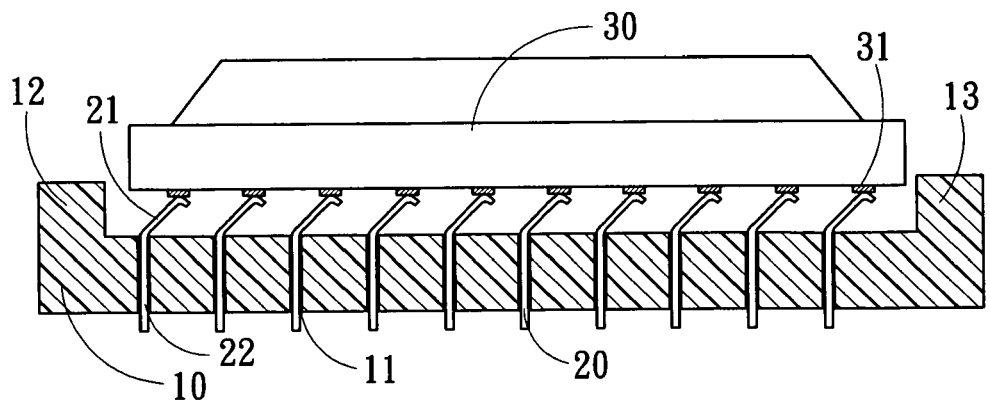
FIG. 2 is a schematic view illustrating the electrical connector shown in FIG. 1 has been assembled with the chip module.
Figure 3:
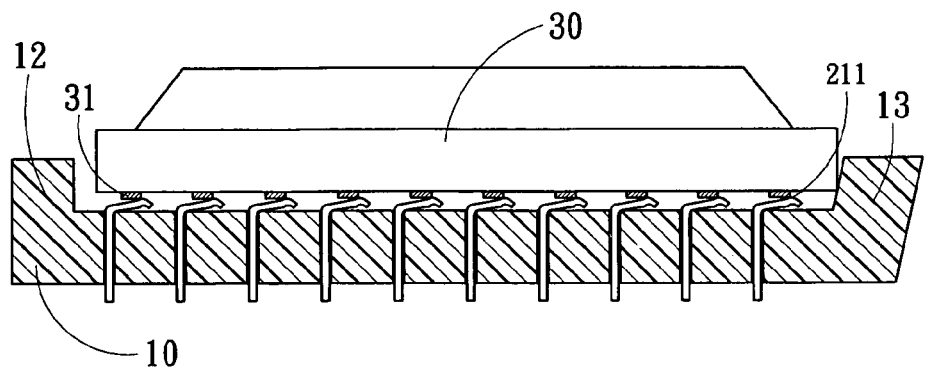
FIG. 3 is a schematic view illustrating the electrical connector shown in FIG. 2 has been assembled with the chip module and the chip module is pressed downwards.
Figure 4:
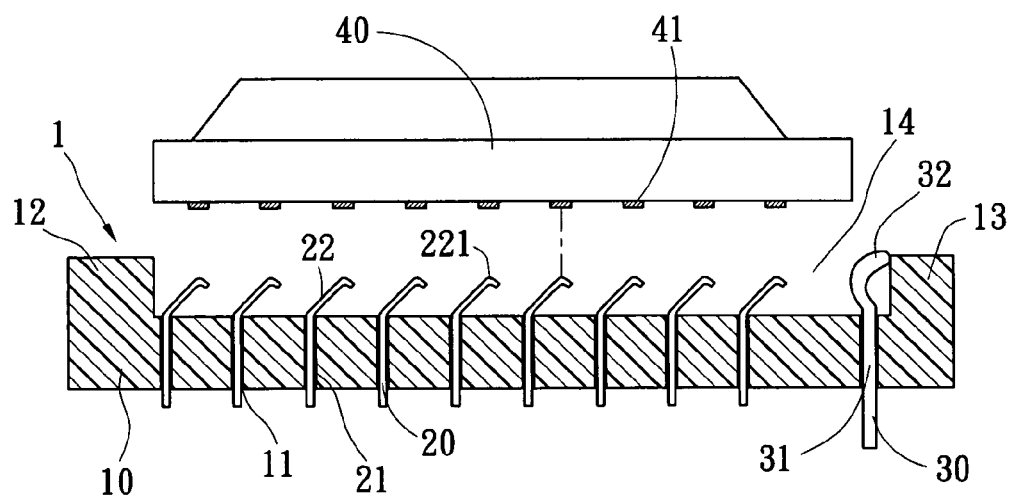
FIG. 4 is a schematic view illustrating an electrical connector according to this invention before being assembled with a chip module.

With reference to FIG. 4, an electrical connector according to this invention is used to electrically connect a chip module 40 to a PCB (not shown). As shown in FIG. 4, the electrical connector 1 comprises an insulation body 10 and a plurality of terminals 20. The insulation body 10 is provided with a plurality of terminal accommodation holes 11; the terminals 20 are accommodated in the terminal accommodation holes 11, and the insulation body 10 is provided with a first sidewall 12 and a second sidewall 13 that are opposite to each other. An accommodation space 14 for the chip module 40 is enclosed in the first sidewall 12 and the second sidewall 13.

Each terminal 20 comprises a wedge part 21 accommodated in the terminal accommodation hole 11, and an elastic arm 22 stretching from the wedge part 21. The elastic arm 22 is lengthwise, located in the accommodation space 14, and provided with a contact portion 221 contacting an electrically conductive slice 41 of the chip module 40.

Further, the electrical connector 1 is provided with an elastic part 30 accommodated in the insulation body 10. The elastic part 30 lies at a side toward which the elastic arm 22 of terminal 20 stretches and the elastic part 30 leans against the second sidewall 13 of the insulation body 10. The elastic part 30 comprises a holding part 31 accommodated in the insulation body 10, and a supporting part 32 stretching from the holding part 31.

Figure 5:
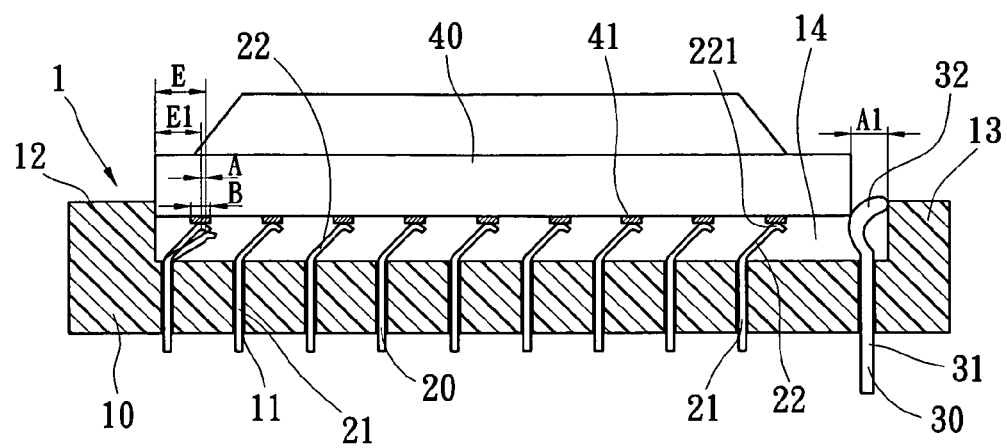
FIG. 5 is a schematic view illustrating the electrical connector when assembled with the chip module that is shown in shown in FIG. 4.
Figure 6:
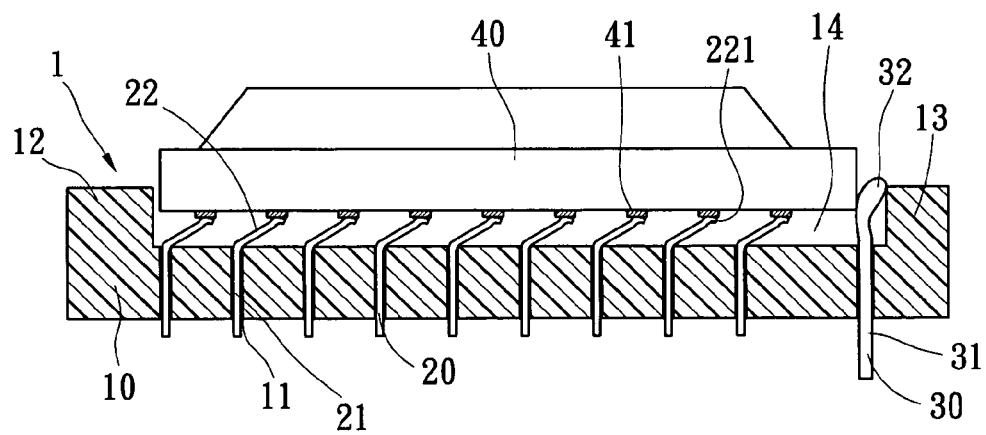
FIG. 6 is a schematic view illustrating the electrical connector and the chip module as shown in FIG. 5 and the chip module is pressed downwards.

With reference to FIG. 5 and FIG. 6, when being assembled, the chip module 40 is pressed to locate in the accommodation space 14 and then to contact the terminal 20. The chip module 40 is firstly pressed downwards, and when each of the electrically conductive slices 41 of the chip module 40 contacts the contact portion 221 of the elastic arm 22 of each terminal 20 at the right moment, as shown in FIG. 5, the chip module 40 is continually pressed downwards to fully locate in the accommodation space 14 of the insulation body 10; when the chip module 40 is continually pressed downwards, the chip module 40 makes the pressed elastic arm 22 of the terminal 20 to be properly bent forward and downwards, as shown in FIG. 4 through FIG. 6, and then makes the pressed elastic arm 22 shift to the second sidewall 13. Being lengthwise, the elastic arm 22 that receives the pressed force from the chip module is bent and deformed to a higher extent and indirectly drives the chip module 40 to forward move slowly, and thereby the chip module 40 slowly approaches to the second sidewall 13 of the insulation body 10. The elastic part 30 is provided in the insulation body 10 and the accommodation space 14 and near the second sidewall 13. In FIG. 5 and FIG. 6, the chip module 40 leans against the supporting part 32 of the elastic part 30 but not the second sidewall 13. The supporting part 32 drives the chip module 40 to properly move toward the first sidewall 12 so as to make sure the precisely location between the electrically conductive slice 41 of the chip module 40 and the contact portion 221 of the terminal 20.

As shown in FIG. 5, when the chip module 40 is completely located in the insulation body 10, the distance from the electrically conductive slice 41 (closest to the first sidewall 12) of the chip module 40 to the first sidewall 12 is defined as E1, the width of the electrically conductive slice 41 is defined as B, and the distance from the electrically conductive slice 41 (closest to the first sidewall 12) to the corresponding sidewall of chip module 40 is defined as E; the difference between E1 and E is just right half the width B of the electrically conductive slice 41. Further, the distance from the second sidewall 13 to the sidewall (closest to the second sidewall 13) of the chip module 40 is defined as A1. The transversely distance between the contact portion 221 of the terminal 20 before and after deformed is defined as A, and the difference between A1 and A is just right half the width B of the electrically conductive slice 41.

Thus, when the chip module 40 leans against the second sidewall 13, the transversally moving distance for the contact portion 221 of the terminal 20 is defined as A and the maximum moving distance for the chip module 40 in the transversally direction is defined as A1, namely the distance from the second sidewall 13 to the sidewall of chip module 40, and thereby the chip module 40 is just right arranged between the first sidewall 12 and the elastic part 30.

While the invention has been described in terms of what is presently considered to be the most practical and preferred embodiments, it is to be understood that the invention needs not be limited to the disclosed embodiment.

On the contrary, it is intended to cover various modifications and similar arrangements included within the spirit and scope of the appended claims which are to be accorded with the broadest interpretation so as to encompass all such modifications and similar structures.

What is claimed is:

1. An electrical connector for electrically connecting a chip module to a PCB, comprising:
    an insulation body provided with a first sidewall, a second sidewall opposite to the first sidewall, and an accommodation space for the chip module laterally between the first and second sidewalls;
    a plurality of terminals, separately accommodated in the insulation body; each terminal being provided with an elastic arm protruding into the accommodation space and extending toward the second sidewall of the insulation body, the elastic arm being provided with a contact portion for contacting an electrically conductive slice of the chip module; and
    an elastic part disposed adjacent the second sidewalls of the insulation body, the elastic part being configured to deflectively guide downward and lateral advancement of the chip module into the accommodation space of the insulation body, and thereby precisely locate the electrically conductive slices upon the contact portions, wherein the difference between the distance from the second sidewall to the corresponding sidewall of chip module and the distance of the contact portion before and after the terminals are deformed is approximately half the width of the electrically conductive slice.

2. The electrical connector according to claim 1, wherein the elastic part leans against the second sidewall of the insulation body.

3. The electrical connector according to claim 1, wherein the difference between the distance from the electrically conductive slice to the first sidewall and the distance from the electrically conductive slice to the corresponding sidewall of the chip module when advanced into the accommodation space is half the width of the electrically conductive slice.

4. The electrical connector according to claim 1, wherein the lateral displacement of the contact portion responsive to the deflection of the elastic part is approximately half the width of the electrically conductive slice.

5. The electrical connector according to claim 1, wherein the elastic part includes an holding portion and a supporting portion extending therefrom, the holding portion being coupled to the intermediate portion of the insulation body, the supporting portion having a bulbous contour.

6. The electrical connector according to claim 5, wherein the supporting portion of the elastic part is deflected toward the second sidewall of the insulation body to a less bulbous contour by the chip module during the advancement thereof into the accommodation space.

7. An electrical connector, which is used to electrically connect a chip module to a PCB, comprising:
    an insulation body provided with a first sidewall, a second sidewall opposite to the first sidewall, and an accommodation space for the chip module enclosed in the first and second sidewalls;

a plurality of terminals separately accommodated in the insulation body; each terminal being provided with an elastic arm that is protruding and stretching into the accommodation space and the elastic arm being provided with a contact portion for contacting an electrically conductive slice of the chip module; and an elastic part lying at a side toward which the elastic arm of the terminal stretches, while the chip module is being pressed to move toward the elastic part in the accommodation space and lean against the elastic part, the elastic part precisely locating the electrically conductive slice and the contact portion, wherein the difference between the distance from the electrically conductive slice to the first sidewall and the distance from the electrically conductive slice to the corresponding sidewall of the chip module is approximately half the width of the electrically conductive slice.

* * * * *